(12) United States Patent
Mulder et al.

(10) Patent No.: US 6,255,822 B1
(45) Date of Patent: Jul. 3, 2001

(54) MRI APPARATUS HAVING A SHORT UNIFORM FIELD MAGNET WITH AN INTERNAL SPACE

(75) Inventors: Gerardus B. J. Mulder; Gerardus N. Peeren, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/415,158

(22) Filed: Oct. 8, 1999

(30) Foreign Application Priority Data

Oct. 9, 1998 (EP) .................................................. 98203424

(51) Int. Cl.[7] ...................................................... G01V 3/00
(52) U.S. Cl. ......................... 324/318; 324/319; 324/322
(58) Field of Search ..................................... 324/318, 319, 324/322, 309, 320; 335/216, 299

(56) References Cited

U.S. PATENT DOCUMENTS

| | | |
|---|---|---|
| 4,587,504 | 5/1986 | Brown et al. ........................ 335/216 |
| 5,396,208 | 3/1995 | Overweg et al. .................... 335/301 |
| 5,565,831 | 10/1996 | Dorri et al. ......................... 335/216 |

FOREIGN PATENT DOCUMENTS

| | | | |
|---|---|---|---|
| 0160350A1 | 11/1985 | (EP) | .............................. G01N/24/06 |
| 0826977 | 3/1998 | (EP) | .............................. G01R/33/38 |

*Primary Examiner*—Jay Patidar
*Assistant Examiner*—Brij B. Shrivastav
(74) *Attorney, Agent, or Firm*—John F. Vodopia

(57) ABSTRACT

In an MRI apparatus for medical purposes it is desirable to minimize the length of the magnet system for generating the main field, inter alia in order to keep the accessibility of the region to be examined in the imaging volume as high as possible for the attending staff. In order to save costs it is also desirable to make the diameter of the magnet system as small as possible. According to the invention a short, actively shielded magnet system is obtained in that the turns of the magnet system are situated in an imaginary U-shaped space 43 with the opening of the U facing the axis 35. The current component in the bottom 37 of the U has a value which is smaller than that of the current component in the limbs 47a, 47b of the U. The inner space 49 of the U does not contain a current for generating a contribution to the main field in the measuring space 29 of the apparatus. Consequently, a free inner space is formed in the magnet system; this free space can be used, for example to accommodate gradient coils and/or RF coils.

4 Claims, 4 Drawing Sheets

MRI APPARATUS HAVING A SHORT UNIFORM FIELD MAGNET WITH AN INTERNAL SPACE

BACKGROUND OF THE INVENTION

1. Field of the Invention

The invention relates to a magnetic resonance imaging apparatus which includes a coil system which is substantially rotationally symmetrically arranged about a symmetry axis, and a power supply device for feeding the coil system with current in order to generate a steady, homogeneous magnetic field in a measuring space of the apparatus, which coil system consists of a first and a second substantially rotationally symmetrical coil sub-system, said two coil sub-systems being situated in a substantially rotationally symmetrical space which has a U-shaped cross-section in a plane containing the symmetry axis, the open side of said U-shaped cross-section facing the symmetry axis and the rotationally symmetrical space of U-shaped cross-section containing a first sub-space parallel to the symmetry axis and a second sub-space transverse the symmetry axis, the first coil sub-system being situated exclusively in the first sub-space whereas the second coil sub-system is situated exclusively in the second sub-space, the first coil sub-system conducting a first current component whereas the second coil sub-system conducts a second current component, the two current components having mutually opposed directions.

2. Description of Related Art

A magnetic resonance imaging apparatus for medical purposes, also referred to as an MRI apparatus, is arranged to form images of cross-sections of a body. To this end, in such an apparatus a strong, steady, homogeneous magnetic field is generated in a volume intended for imaging (the imaging volume). On this homogeneous field a gradient field is superposed in order to indicate the location of the cross-section to be imaged. The atoms in the tissue present in the imaging volume are then excited by means of an RF field; the radiation released upon relaxation of the excited atoms is used to form an image of the cross-section indicated by the gradient field. The steady, homogeneous field (also referred to as the main field) is generated by means of a coil system (superconducting or not). Together with the associated envelope, the coil system is shaped as a short tube which contains the imaging volume. The diameter of this tube is determined by the dimensions of the patients to be examined so that it has a given minimum value, for example of the order of magnitude of 90 cm. Generally speaking, the aim is to minimize the length of this tube relative to the diameter in order to mitigate feelings of claustrophobia for the patients to be examined and to keep the area to be examined in the imaging volume as accessible as possible for the attending staff.

The cited European patent application describes an MRI apparatus having a comparatively short coil system, so a short tubular patient space. Notably FIG. 5 of the cited patent application shows a rotationally symmetrical coil system which is composed of a number of coils (denoted by the references 19, 20 and 21) which form part of two imaginary coil sub-systems. Thus, the coils 19 and 21 shown form part of a first imaginary coil sub-system and the coils 20 shown form part of a second imaginary coil sub-system.

These two coil sub-systems are arranged in a rotationally symmetrical space about a symmetry axis (denoted by the reference 7). This space can be considered to be the envelope of the coils 19–21 such that it has a U-shaped cross-section in a plane through the symmetry axis, the open side of the U facing the symmetry axis. The first sub-space is then formed by the part of the U which extends parallel to the symmetry axis whereas the second sub-space is formed by the two limbs of the U which, therefore, extend perpendicularly to the symmetry axis. The first coil sub-system (i.e. the sub-system consisting of the coils 19 and 21) is then situated in the first sub-space and the second coil sub-system (i.e. the sub-system consisting of the coils 20) is situated in the second sub-space. A power supply device applies a current through the coils; this current may be considered to consist of two components, i.e. a first current component which flows through the first coil sub-system and a second current component which flows through the second coil sub-system. The two current components thus defined have mutually opposed directions in the known MRI apparatus as appears from the "Table 3" included in the cited document and from the associated description. In the known coil system a further coil (denoted by the reference numeral 18) is situated in the space between the two limbs of the U and also contributes to the generating of the main field.

Even though this known coil assembly realizes a short tubular patient space, it does not provide shielding of the main field. If such shielding were required, the known system would have to be provided with additional means for shielding, for example active shielding coils which counteract the magnetic stray field outside the imaging volume as well as possible. Furthermore, in the tubular patient space of the known system a space has to be reserved for gradient coils and for coils for forming the RF field, so that the accessibility of the region to be examined is restricted to an undesirable extent.

Citation of a reference herein, or throughout this specification, is not to construed as an admission that such reference is prior art to the Applicant's invention of the invention subsequently claimed.

SUMMARY OF THE INVENTION

It is an object of the invention to provide an MRI apparatus of the kind set forth in which the main field of the apparatus is provided with active shielding and in which suitable accessibility of the region to be examined is achieved while preserving a sufficiently short tubular patient space nevertheless.

To achieve this, the MRI apparatus according to the invention is characterized in that in an absolute sense the value of the first current component is smaller than that of the second current component, and that the space which is enclosed by the first sub-space and the symmetry axis and does not belong to the second sub-space does not contain a current for generating a contribution to the steady, homogeneous magnetic field in the measuring space of the apparatus.

Even though both current components contribute to the formation of the main field, the principal function of the first current component is to provide the active shielding whereas the principal function of the second current component is the formation of the main field. The invention is also based on the recognition of the fact that a configuration of coils can be realized for which it is not necessary to provide current conductors in the space which is enclosed by the first sub-space and the symmetry axis and does not belong to the second sub-space (in the coil configuration which is known from the cited patent specification, this is the space between the limbs of the U in which the coil 18 is situated). The intermediate space thus vacated can be used to accommodate other components such as gradient coils and/or RF coils.

The second sub-space in an embodiment of the invention consists of two mutually substantially parallel sub-sub-spaces, said sub-sub-spaces being situated to both sides of the first sub-space. An attractive degree of symmetry of the construction of the coil system is thus achieved, so that the number of different coils is minimized; this is attractive from a manufacturing point of view.

The second current component in a preferred embodiment of the invention consists of a first sub-component whose direction is the same as that of the second current component, and a second sub-component whose direction opposes that of the second current component, the conductors of the second sub-component being situated nearer to the symmetry axis than those of the first sub-component. A computer simulation of this configuration reveals that the field thus obtained has a very high degree of homogeneity and that the previously mentioned intermediate space remains sufficiently large.

BRIEF DESCRIPTION OF THE DRAWING

The invention will be described in detail hereinafter with reference to the Figures. Therein:

FIG. 2b is a sectional view of the configuration of coils as indicated in FIG. 2a;

DETAILED DESCRIPTION OF THE PREFERRED EMBODIMENT

Figure 1:
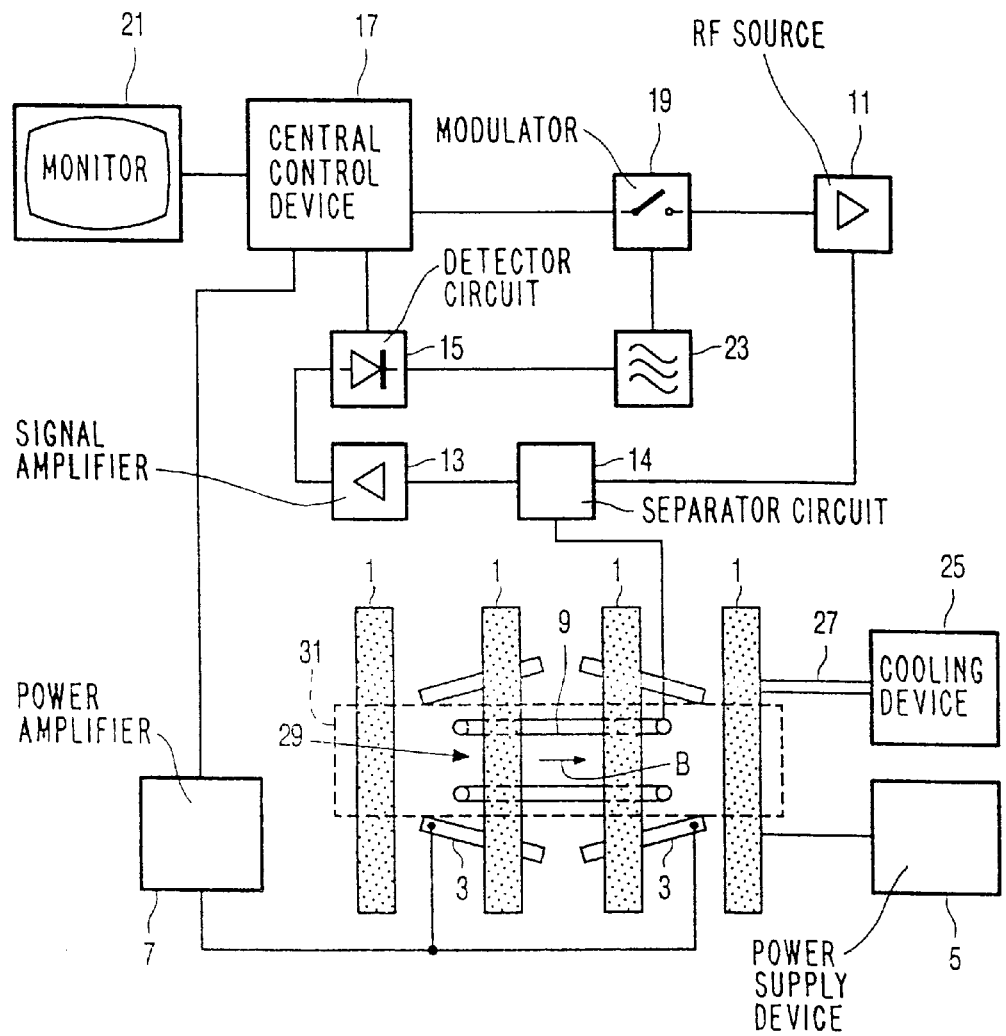
FIG. 1 shows diagrammatically the general construction of a magnetic resonance imaging apparatus.

The magnetic resonance imaging apparatus which is diagrammatically shown in FIG. 1 includes a first magnet system 1 for generating a steady, homogeneous magnetic field B, a second magnet system 3 (the gradient coil system) for generating magnetic gradient fields, a power amplifier 7 for the gradient coil system 3, and a power supply device 5 for the first magnet system 1. An RF coil 9 serves to generate an RF magnetic alternating field; to this end, it is connected to an RF transmitter device which includes an RF source 11. The RF coil 9 can also be used for the detection of spin resonance signals generated by the RF transmitter field in an object to be examined (not shown); to this end, the RF coil is connected to an RF receiver device which includes a signal amplifier 13. The output of the signal amplifier 13 is connected to a detector circuit 15 which is connected to a central control device 17. The central control device 17 also controls a modulator 19 for the RF source 11, the power amplifier 7 and a monitor 21 for image display. An RF oscillator 23 controls the modulator 19 as well as the detector 15 which processes measuring signals. A cooling device 25 with cooling ducts 27 is provided for cooling the magnet coils of the first magnet system 1. The RF coil, arranged within the magnet systems 1 and 3, encloses a measuring space 29 which, in the case of an apparatus for medical diagnostic measurements, is spacious enough to accommodate a patient to be examined or a part of a patient to be examined, for example the head and the neck. Thus, a steady magnetic field B, gradient fields for selecting object slices, and a spatially homogeneous RF alternating field can be generated in the measuring space 29. The RF coil 9 can combine the functions of transmitter coil and measuring coil; in that case a separator circuit 14 is provided in order to separate the forward and the return signal traffic. Alternatively, different coils can be used for the two functions; for example, surface coils then act as measuring coils. If desired, the coil 9 may be enclosed by an RF field shielding Faraday cage 31.

Figure 2A:
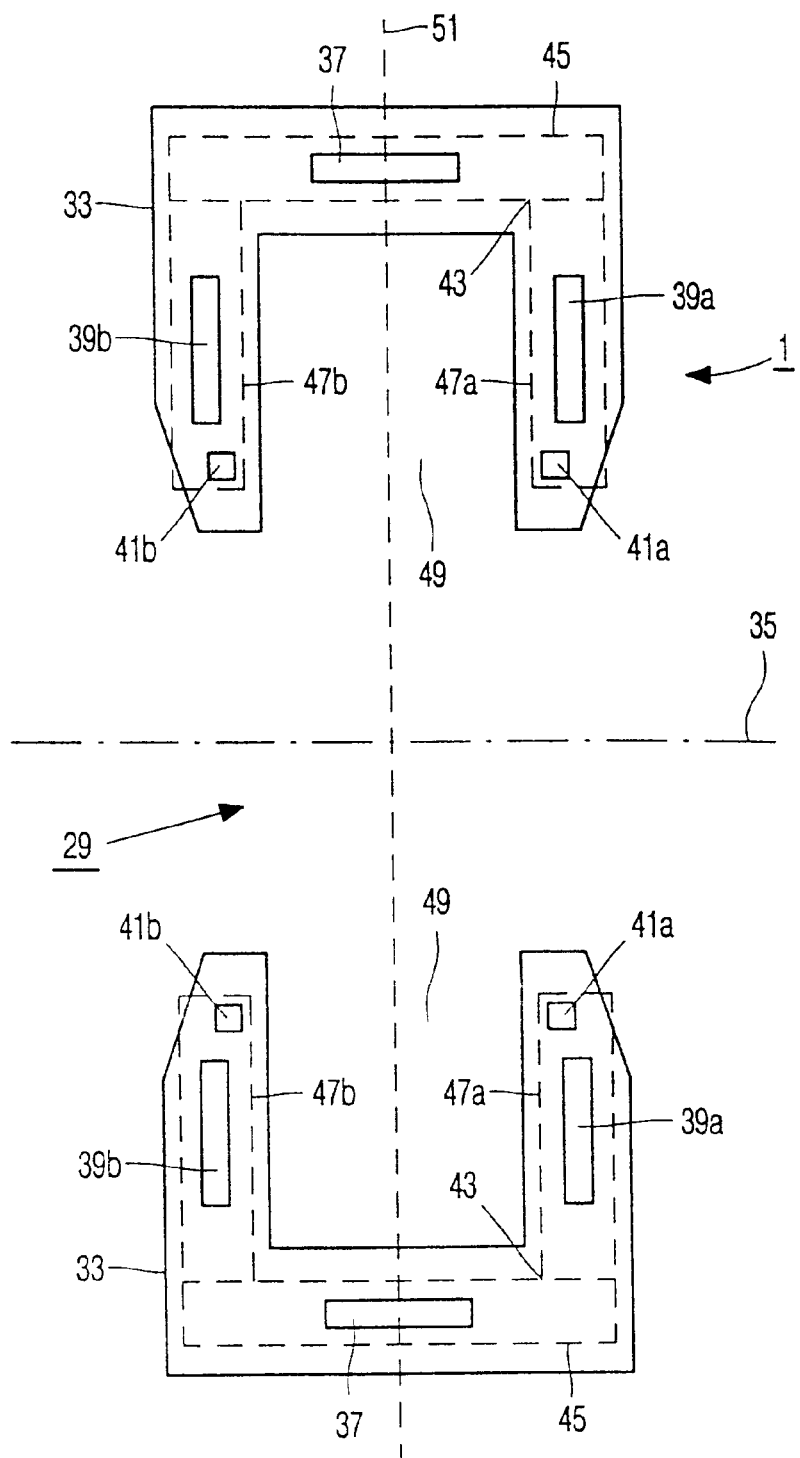
FIG. 2a is a sectional view of the housing with the coils for generating the main field according to the invention.

FIG. 2a is a sectional view of the housing of the coils, with the coils for generating the main field according to the invention. The housing 33 accommodates a coil system which is rotationally symmetrical relative to a symmetry axis 35 and consists of the coils 37, 39a, 39b, 41a and 41b. The coils 39a and 39b are identical in respect of dimensions and the currents flowing therethrough, like the coils 41a and 41b. The coil 37 per se constitutes a first coil sub-system whereas the coils 39a, 39b, 41a and 41b together constitute a second coil sub-system.

Both above-mentioned coil sub-systems are situated in an imaginary rotationally symmetrical space 43 which may be considered to be composed of imaginary sub-spaces 45 and 47, the sub-space 45 extending parallel to the symmetry axis. The imaginary sub-space 47 may be considered to consist of two mutually parallel sub-sub-spaces 47a, 47b which extend perpendicularly to the symmetry axis. Said sub-spaces 45, 47a and 47b thus together constitute the rotationally symmetrical space 43 which has a U-shaped cross-section in a plane containing the symmetry axis 35. The open side of said U-shaped cross-section faces the symmetry axis 35.

The first sub-space 45 and the two second sub-spaces 47a and 47b enclose a space 49 which does not contain current conductors for generating a contribution to the steady, homogeneous magnetic field in the measuring space 29 of the apparatus. Therefore, this space can be used for other purposes, for example the mounting of gradient coils, RF coils or other components to be used in the measuring space or its vicinity.

Figure 2B:
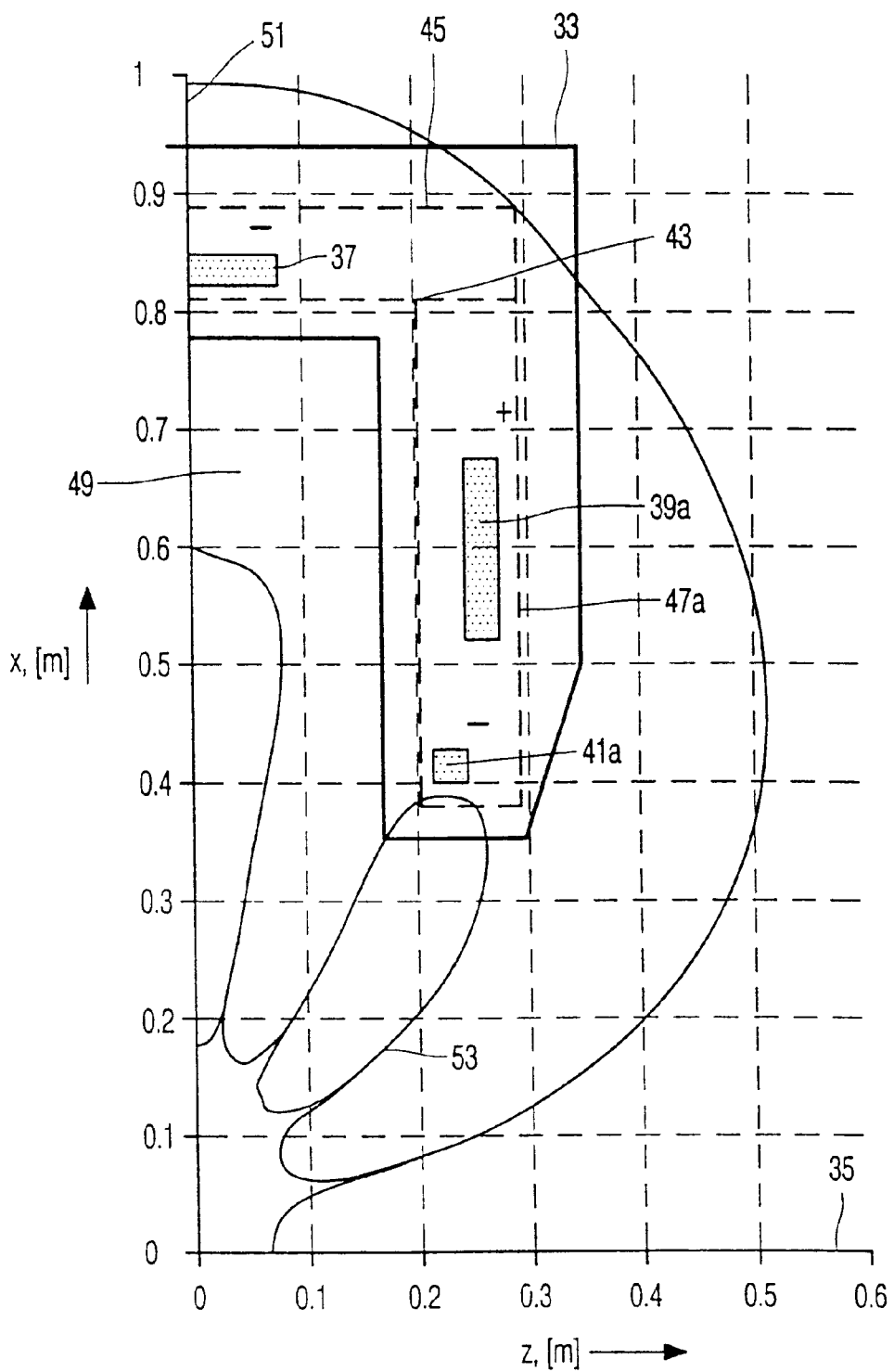

FIG. 2b is a more detailed representation of the coil configuration of FIG. 2a. Because of its symmetry, only a part of this configuration is shown. In order to complete the representation of the coils, FIG. 2b is to be considered to be mirrored relative to the vertical axis 51, and the figure thus obtained should be mirrored again relative to the horizontal axis 35, also being the axis of rotational symmetry. Because of the described symmetry, therefore, only the coils 39a and 41a of the coil system in this Figure are shown completely, and the coil 37 is shown partly. Moreover, in this Figure a contour line 53 indicates a deviation of the homogeneity of the main field of 10 ppm for a strength of 0.5 T of the main field. In FIG. 2b it is assumed that the coils are homogeneously filled with current. The dimensions and the excitations of the coils are as stated in Table 1, in which $s_1$ and $s_2$ denote the distances between the vertical axis 51 and the left boundary and the right boundary, respectively, of the coils, and in which $h_1$ and $h_2$ are the distances between the symmetry axis 35 and the lower boundary and the upper boundary, respectively, of the coils, and nI denotes the number of ampere turns, so the total current through the coil. The value stated for the current is the overall value flowing through the two coils 39a, 39b and 41a, 41b, respectively, whereas the current through the coil 37 is that flowing through the entire coil 37 of FIG. 2a.

TABLE 1

|  | 37 | 39a | 41a |
|---|---|---|---|
| $S_1$ | — | 245.0 mm | 215.3 mm |
| $S_2$ | 80.0 mm | 275.0 mm | 245.3 mm |
| $h_1$ | 821.7 mm | 520.0 mm | 400.1 mm |
| $h_2$ | 849.3 mm | 676.0 mm | 428.4 mm |
| nI | $-429.0 \times 10^3$ At | $+911.6 \times 10^3$ At | $-165.4 \times 10^3$ At |

In order to achieve an accuracy of 500 ppm for the strength of the main field, a dimensional tolerance of 0.2 mm can be permitted. A coil system can be constructed while taking into account these dimensional tolerances, after which the further adaptation of the main field so as to achieve a maximum deviation of 10 ppm for the homogeneity of the main field can be performed in known manner by means of a shim system. This further adaptation of the main field is customarily performed in MRI and need not be elaborated herein.

Figure 3:
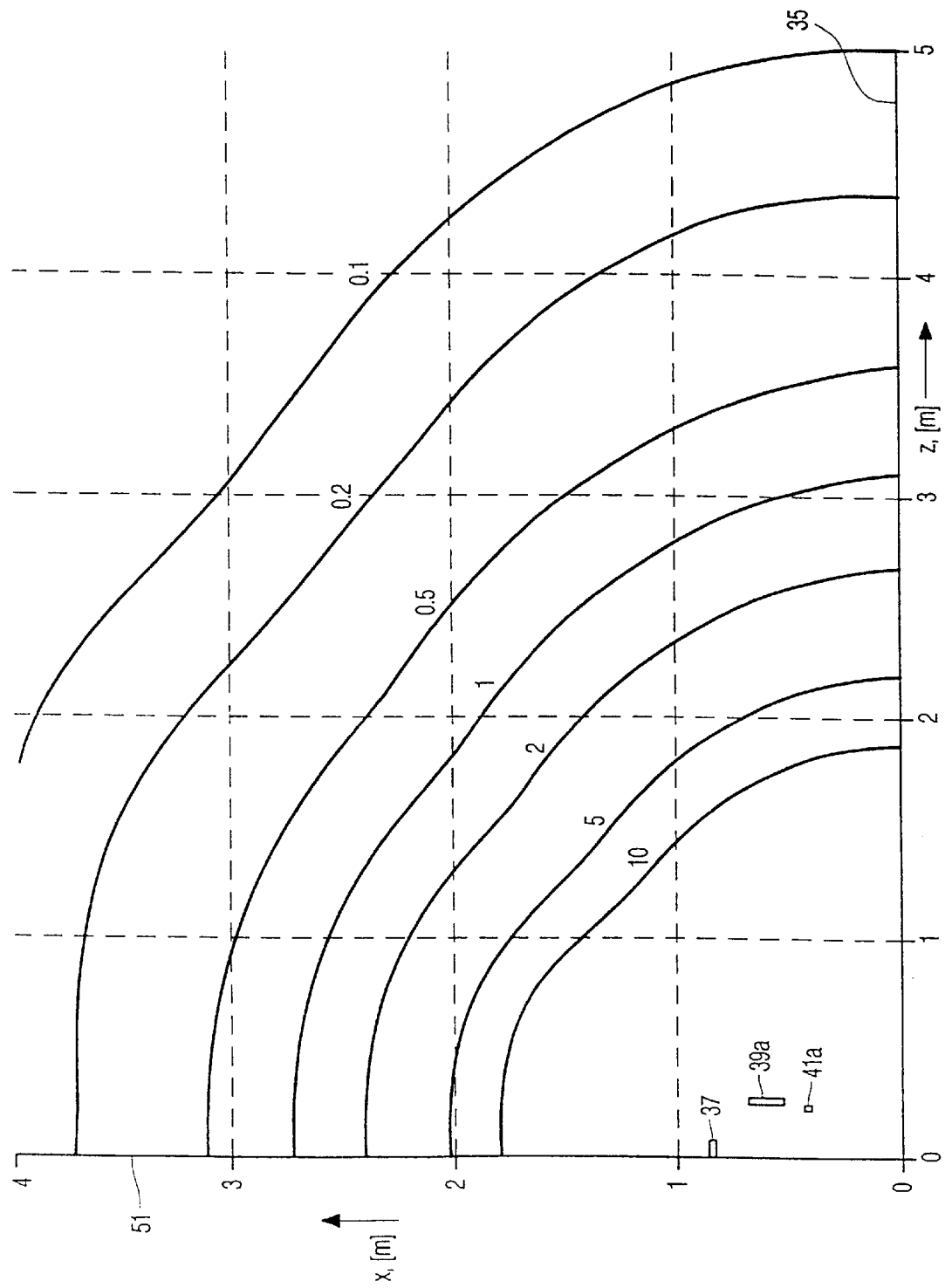
FIG. 3 is a graphic representation of the magnetic stray field which occurs in the case of the coil configuration shown in FIG. 2b.

FIG. 3 is a graphic representation of the magnetic stray field occurring in the case of the coil configuration of FIG. 2b and a strength of the main field amounting to 0.5 T. The strength of the stray field is indicated in mT for each of the contour lines of this graph. The graph, in which the coils 37, 39a and 41a are also represented, shows that the active shielding offered by the coil system according to the invention causes the strength of the stray field to drop quickly to very low values; for example, at a distance of approximately 3.6 m from the center of the imaging volume, the stray field has decreased to approximately 0.5 mT (i.e. a commonly accepted safety limit), and at a distance of 5 m it has decreased to a value of 0.1 mT (i.e. a commonly accepted limit concerning the use of a color television picture tube in an image display unit).

All references cited herein are incorporated herein by reference in their entirety and for all purposes to the same extent as if each individual publication or patent or patent application was specifically and individually indicated to be incorporated by reference in its entirety for all purposes.

What is claimed is:

1. A magnetic resonance imaging apparatus comprising:
a coil system which is substantially rotationally symmetrically arranged about a symmetry axis, and
a power supply device for feeding the coil system with current in order to generate a steady, homogeneous magnetic field in a measuring space of the apparatus;
wherein the coil system comprises a first and a second substantially rotationally symmetrical coil sub-system, said two coil sub-systems being situated in a substantially rotationally symmetrical space which has a U-shaped cross-section in a plane containing the symmetry axis, the open side of said U-shaped cross-section facing the symmetry axis, and the rotationally symmetrical space of U-shaped cross-section containing a first sub-space parallel to the symmetry axis and a second sub-space transverse to the symmetry axis,
the first coil sub-system being situated exclusively in the first sub-space whereas the second coil sub-system is situated exclusively in the second sub-space,
the first coil sub-system conducting a first current component whereas the second coil sub-system conducts a second current component, the two current components having mutually opposed directions,
the value of the first current component being smaller in an absolute sense than that of the second current component, and
the space which is enclosed by the first sub-space and the symmetry axis and which does not belong to the second sub-space and does not contain a current for generating a contribution to the steady, homogeneous magnetic field in the measuring space of the apparatus.

2. A magnetic resonance imaging apparatus as claimed in claim 1 wherein the second sub-space comprises two mutually substantially parallel sub-sub-spaces, said sub-sub-spaces being situated to both sides of the first sub-space.

3. A magnetic resonance imaging apparatus as claimed in claim 1 wherein the second current component comprises a first sub-component whose direction is the same as that of the second current component, and a second sub-component whose direction opposes that of the second current component, the conductors of the second sub-component being situated nearer to the symmetry axis than those of the first sub-component.

4. The apparatus of claim 2 wherein the second current component comprises a first sub-component whose direction is the same as that of the second current component, and a second sub-component whose direction opposes that of the second current component, the conductors of the second sub-component being situated nearer to the symmetry axis than those of the first sub-component.

* * * * *